United States Patent
Pandey et al.

(10) Patent No.: US 10,394,143 B2
(45) Date of Patent: Aug. 27, 2019

(54) TOPOGRAPHY MEASUREMENT SYSTEM

(71) Applicant: ASML Netherlands B.V., Veldhoven (NL)

(72) Inventors: Nitesh Pandey, Eindhoven (NL); Arie Jeffrey Den Boef, Waalre (NL); Heine Melle Mulder, Veldhoven (NL); Willem Richard Pongers, Veldhoven (NL); Paulus Antonius Andreas Teunissen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/764,617

(22) PCT Filed: Sep. 6, 2016

(86) PCT No.: PCT/EP2016/070922
§ 371 (c)(1),
(2) Date: Mar. 29, 2018

(87) PCT Pub. No.: WO2017/063789
PCT Pub. Date: Apr. 20, 2017

(65) Prior Publication Data
US 2018/0267415 A1 Sep. 20, 2018

(30) Foreign Application Priority Data
Oct. 15, 2015 (EP) .................................. 15190027

(51) Int. Cl.
*G03F 9/00* (2006.01)
*G03F 7/20* (2006.01)

(52) U.S. Cl.
CPC ........ *G03F 9/7084* (2013.01); *G03F 7/70258* (2013.01); *G03F 9/7049* (2013.01); *G03F 9/7076* (2013.01); *G03F 9/7092* (2013.01)

(58) Field of Classification Search
CPC ... G03F 9/709; G03F 7/70483; G03F 7/70258
(Continued)

(56) References Cited

U.S. PATENT DOCUMENTS 5,191,200 A * 3/1993 van der Werf ....... G02B 21/241
250/201.4
7,580,620 B2 8/2009 Raskar et al.
(Continued)

FOREIGN PATENT DOCUMENTS

WO WO 2009/089999 A1 7/2009
WO WO 2016/058769 A1 4/2016

OTHER PUBLICATIONS

International Search Report and Written Opinion of the International Searching Authority directed to related International Patent Application No. PCT/EP2016/070922, dated Dec. 16, 2016; 9 pages.
(Continued)

*Primary Examiner* — Hung Nguyen
(74) *Attorney, Agent, or Firm* — Sterne, Kessler, Goldstein & Fox P.L.L.C.

(57) ABSTRACT

A topography measurement system comprising a radiation source configured to generate a radiation beam, a spatially coded grating configured to pattern the radiation beam and thereby provide a spatially coded radiation beam, optics configured to form an image of the spatially coded grating at a target location on a substrate, detection optics configured to receive radiation reflected from the target location of the substrate and form an image of the grating image at a second grating, and a detector configured to receive radiation transmitted through the second grating and produce an output signal.

20 Claims, 4 Drawing Sheets

(58) Field of Classification Search
USPC .............................................. 355/52, 55, 67
See application file for complete search history.

(56) References Cited

U.S. PATENT DOCUMENTS

| | | | |
|---|---|---|---|
| 2002/0075990 A1 | 6/2002 | Lanza et al. | |
| 2004/0213463 A1 | 10/2004 | Morrison | |
| 2007/0052113 A1 | 3/2007 | Marokkey et al. | |
| 2009/0153830 A1 | 6/2009 | Kok | |
| 2011/0013171 A1* | 1/2011 | Mueller | G03F 7/70258 355/74 |
| 2012/0099702 A1* | 4/2012 | Engel | A61B 6/00 378/62 |

OTHER PUBLICATIONS

International Preliminary Report on Patentability directed to related International Patent Application No. PCT/EP2016/070922, dated Apr. 17, 2018; 6 pages.

Agrawal et al., "Coded Exposure Deblurring: Optimized Codes for PSF Estimation and Invertibility," Mitsubishi Electric Research Laboratories (MERL), Sep. 2009; 9 pages.

Miyakawa et al., "Coded aperture detector: an image sensor with sub 20-nm pixel resolution," Optical Society of America, Optics Express, vol. 22, No. 16, Aug. 2014; pp. 19803-19809.

Harmany et al., "Spatio-temporal Compressed Sensing with Coded Apertures and Keyed Exposures," IEEE Transactions on Image Processing, Presented at IEEE International Conference on Acoustic, Speech, and Signal Processing, SPIE Electronic Imaging Conference, and SPIE Photonics Europe Conference, 2008; pp. 1-15.

McCloskey et al., "Design and Estimation of Coded Exposure Point Spread Functions," IEEE Transactions on Pattern Analysis and Machine Intelligence, vol. 34, No. 10, Oct. 2012; pp. 2071-2077.

Van Der Werf J.E., "Optical focus and level sensor for wafer steppers," American Vacuum Society, Journal of Vacuum Science and Technology B: Microelectronics and Nanometer Structures Processing, Measurement, and Phenomena, vol. 10, 1992; pp. 735-740.

* cited by examiner

21

20

TOPOGRAPHY MEASUREMENT SYSTEM

CROSS-REFERENCE TO RELATED APPLICATIONS

This application claims priority of EP application 15190027.1 which was filed on 15 Oct. 2015 and which is incorporated herein in its entirety by reference.

FIELD

The present invention relates to a topography measurement system and method. The topography measurement system may form part of a lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g. a mask) onto a layer of radiation-sensitive material (resist) provided on a substrate (e.g. a silicon wafer).

Before a pattern is projected from a patterning device onto a layer of radiation sensitive material provided on a substrate the topography of the substrate is measured. In order to achieve this, the lithographic apparatus is provided with a topography measurement system. The topography measurement system measures the height of the substrate across the surface of the substrate. These height measurements are used to form a height map which assists accurate projection of a pattern onto the substrate.

It may be desirable to provide, for example, a topography measurement system which obviates or mitigates one or more of the problems of the prior art, whether identified herein or elsewhere.

SUMMARY

According to a first aspect of the invention, there is provided a topography measurement system comprising a radiation source configured to generate a radiation beam, a spatially coded grating configured to pattern the radiation beam and thereby provide a spatially coded radiation beam, optics configured to form an image of the spatially coded grating at a target location on a substrate, detection optics configured to receive radiation reflected from the target location of the substrate and form an image of the grating image at a second grating, and a detector configured to receive radiation transmitted through the second grating and produce an output signal.

An advantage provided by the spatial coding is that spatial resolution of the measurements provided by the topography measurement system is not determined by the size of the image of the grating but instead is determined by the size of coded features of the image of the grating.

The topography measurement system may further comprise a processor configured to apply a decoding sequence to the output signal and thereby produce an output signal indicative of the height of the substrate.

The processor may be configured to apply a decoding matrix which is an inverse of a matrix used to code the spatially coded grating.

The processor may be configured to apply a decoding matrix which is based upon an inverse of a matrix used to code the spatially coded grating but which has been modified before use.

The spatially coded grating may be configured to pattern the radiation beam comprises a grating coded by a Hadamard matrix or a uniformly redundant array.

The spatially coded grating may be configured to pattern the radiation beam comprises a grating coded by a random sequence or a pseudo-random sequence.

The spatially coded grating may be coded such that a Fourier transform of the spatially coded grating does not include periodic frequency gaps.

The spatial coding applied to the grating may have a generally broad and generally flat frequency spectrum The smallest features of the spatially coded grating may have a feature size of 20 microns or less.

The smallest features of the spatially coded grating may have a feature size greater than 150 nm.

The radiation beam may be incident upon the substrate with an angle of incidence of between 75° and 85°.

The angle of incidence may be around 80°.

The second grating may have a pitch which corresponds with a pitch that the spatially coded grating would have if spatial coding had not been applied to the spatially coded grating.

The second grating may have a pitch which is a multiple of or a fraction of a pitch that the spatially coded grating would have if spatial coding had not been applied to the spatially coded grating.

According to a second aspect of the invention there is provided a topography measurement apparatus comprising a plurality of topography measurement systems according to the first aspect of the invention.

According to a third aspect of the invention there is provided a lithographic apparatus comprising an illumination system configured to condition a radiation beam, a support constructed to support a patterning device, the patterning device being capable of imparting the radiation beam with a pattern in its cross-section to form a patterned radiation beam, a substrate table constructed to hold a substrate, and a projection system configured to project the patterned radiation beam onto a target portion of the substrate, wherein the lithographic apparatus further comprises a topography measurement system or topography measurement apparatus according to the first aspect or the second aspect of the invention.

According to a fourth aspect of the invention there is provided a topography measurement method comprising using a spatially coded grating to pattern a radiation beam and thereby provide a spatially coded radiation beam, forming an image of the spatially coded grating at a target location on a substrate, receiving radiation reflected from the target location of the substrate and forming an image of the grating image at a second grating, and detecting radiation transmitted through the second grating and producing an output signal.

The method may further comprise applying a decoding sequence to the output signal to obtain an output signal indicative of the height of the substrate.

A decoding matrix may be applied to the output signal, the decoding matrix being an inverse of a matrix used to code the spatially coded grating.

A decoding matrix may be applied to the output signal, the decoding matrix being based upon an inverse of a matrix used to code the spatially coded grating but modified before use.

According to a fifth aspect of the invention there is provided a computer program comprising computer readable instructions configured to cause a computer to carry out a method according to the fourth aspect of the invention.

According to a sixth aspect of the invention there is provided a computer readable medium carrying a computer program according to the fifth aspect of the invention.

According to a seventh aspect of the invention there is provided a computer apparatus for a topography measurement system comprising a memory storing processor readable instructions, and a processor arranged to read and execute instructions stored in said memory, wherein said processor readable instructions comprise instructions arranged to control the computer to carry out a method according to the fourth aspect of the invention.

Different aspects of the invention may be combined together. Features of a given aspect of the invention may be combined with one or more other aspects of the invention.

Further aspects of the invention may be represented as follows.

An aspect of the invention relates to a measurement system for measuring a relative position of a target location. Such measurement system may be used to determine the relative position of only that target location, or may be used to determine a topographical profile (topography) of an object by means of determining the relative positions of multiple target locations at that object.

Such a measurement system can be used in a lithographic apparatus to determine the topography of a substrate, and is than referred to as a level sensor. The relative position comprises, e.g., a relative height of a specific target location at a substrate in a lithographic machine. The measurement system comprises a spatially coded grating configured to pattern a radiation beam; a second grating configured for receiving the patterned radiation beam reflected from the target location; and a detector configured for receiving the reflected patterned radiation beam via the second grating and for supplying an output signal representative of the reflected patterned radiation beam received via the second grating.

In a first embodiment the measurement system comprises a digital signal processor configured to perform at least one of following operations: applying a decoding sequence to data representative of the output signal and thereby produce a further output signal indicative of the relative position; applying a decoding matrix which is an inverse of a matrix used to code the spatially coded grating; and applying a decoding matrix which is based upon an inverse of a matrix used to code the spatially coded grating but which has been modified before use.

In a second embodiment the spatially coded grating comprises a result representative of coding a periodic grating by a Hadamard matrix or a uniformly redundant array.

In a third embodiment, the spatially coded grating is representative of a periodic grating coded by one of a random sequence and a pseudo-random sequence.

In a fourth embodiment, the spatially coded grating has a Fourier transform from which periodic frequency gaps are absent.

The invention also relates to a measurement apparatus comprising a plurality of measurement systems according to at least one of above embodiments.

The invention also relates to a lithographic apparatus comprising: an illumination system configured to condition a further radiation beam; a support constructed to support a patterning device, the patterning device being capable of imparting the further radiation beam with a further pattern in its cross-section to form a patterned further radiation beam; a substrate table constructed to hold a substrate; and a projection system configured to project the patterned further radiation beam onto a target portion of the substrate, wherein the lithographic apparatus further comprises a measurement system of any of above embodiments.

The invention also relates to a measurement method comprising measuring a relative position of a target location, the measuring comprising: using a spatially coded grating configured to pattern a radiation beam; and thereby provide a spatially coded radiation beam; using a second grating; receiving via the second grating the patterned radiation beam reflected from the target location; and supplying an output signal representative of the reflected patterned radiation beam received via the second grating.

BRIEF DESCRIPTION OF THE DRAWINGS

Embodiments of the invention will now be described, by way of example only, with reference to the accompanying schematic drawings, in which.

DETAILED DESCRIPTION

Figure 1:
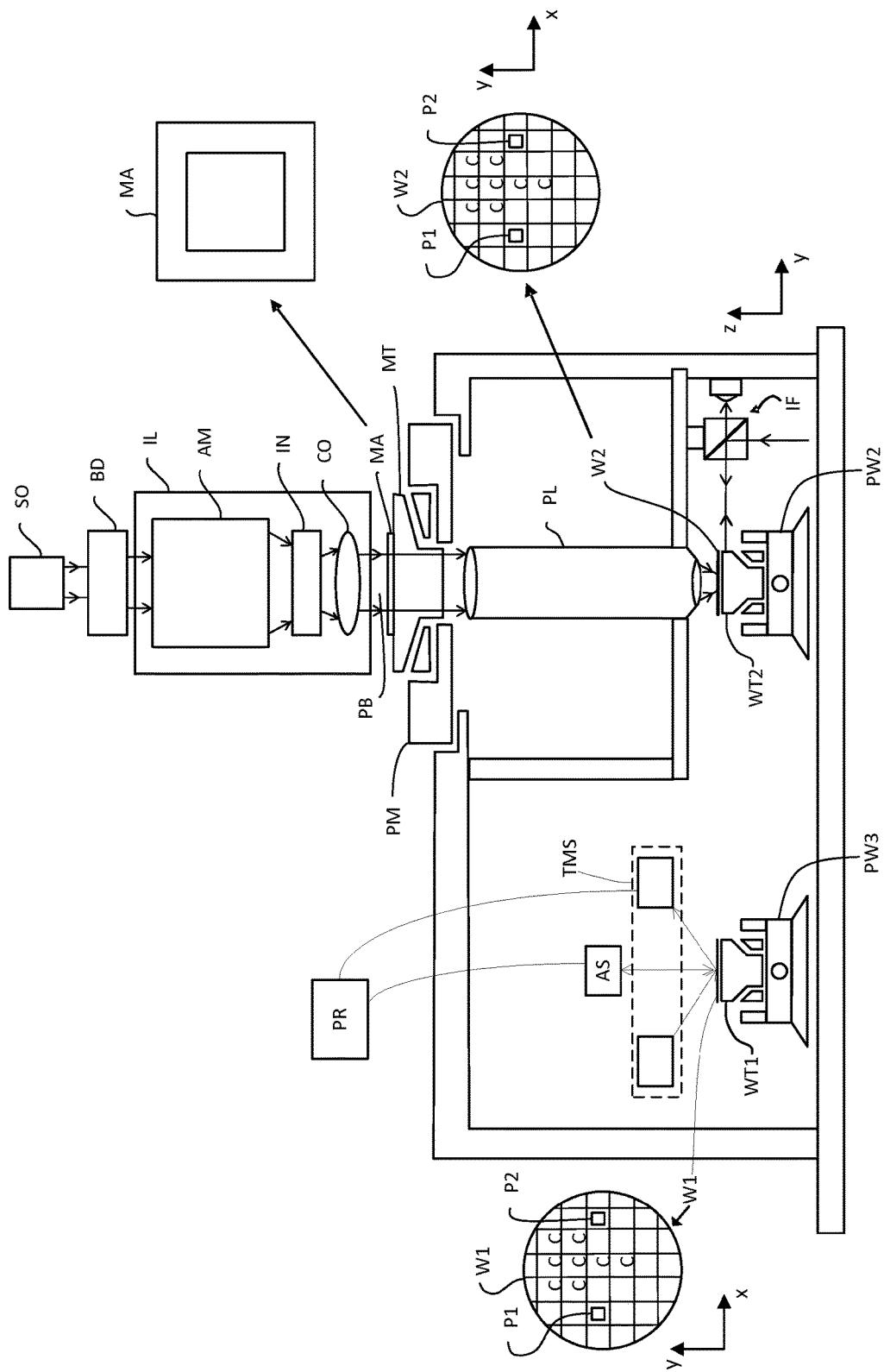
FIG. 1 schematically depicts a lithographic system comprising a topography measurement system according to an embodiment of the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

A support structure holds the patterning device. It holds the patterning device in a way that depends on the orientation of the patterning device, the design of the lithographic apparatus, and other conditions, such as, for example, whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The term "illumination system" used herein may encompass various types of optical components, including refractive, reflective, and catadioptric optical components for directing, shaping, or controlling the beam of radiation, and such components may also be referred to below, collectively or singularly, as a "lens".

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

FIG. 1 schematically depicts a lithographic apparatus comprising a topography measurement system according to a particular embodiment of the invention. The apparatus comprises:

a. an illumination system IL to condition a beam PB of radiation (e.g. DUV radiation or EUV radiation).
b. a support structure (which may be referred to as a mask table) MT to support a patterning device (e.g. a mask) MA and connected to first positioning device PM to accurately position the patterning device with respect to item PL;
c. a substrate table (which may be referred to as a wafer table) WT2 for holding a substrate (e.g. a resist coated wafer) W2 and connected to second positioning device PW2 for accurately positioning the substrate with respect to item PL;
d. another substrate table WT1 for holding a substrate W1 and connected to third positioning device PW3 for accurately positioning the substrate with respect to alignment system AS and topography measurement system TMS; and
e. a projection system (e.g. a refractive projection lens) PL configured to image a pattern imparted to the radiation beam PB by patterning device MA onto a target portion C (e.g. comprising one or more dies) of the substrate W2.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. The source SO and the illuminator IL, together with the beam delivery system BD if required, may be referred to as a radiation system.

The illuminator IL may comprise adjusting means AM for adjusting the angular intensity distribution of the beam. Generally, at least the outer and/or inner radial extent of the intensity distribution in a pupil plane of the illuminator can be adjusted. In addition, the illuminator IL generally comprises various other components, such as an integrator IN and a condenser CO. The illuminator provides a conditioned beam of radiation PB, having a desired uniformity and intensity distribution in its cross section.

The radiation beam PB is incident on the patterning device (e.g. mask) MA, which is held on the support structure MT. Having traversed the patterning device MA, the beam PB passes through the lens PL, which focuses the beam onto a target portion C of the substrate W2. With the aid of the second positioning device PW2 and position sensor IF (e.g. an interferometric device), the substrate table WT2 can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed.

The lithographic apparatus may for example move the patterning device MA and the substrate W2 with a scanning motion when projecting the pattern from the patterning device onto a target portion C. Cartesian coordinates are indicated in FIG. 1. As is conventional, the z-direction corresponds with an optical axis of the radiation beam PB. In an embodiment in which the lithographic apparatus is a scanning lithographic apparatus, the y-direction corresponds with the direction of scanning motion.

As depicted, the lithographic apparatus may be of a type having two (dual stage) or more substrate tables WT1, WT2. In a dual stage lithographic apparatus two substrate tables WT1, WT2 are provided in order to allow properties of one substrate W1 to be measured whilst exposure of another substrate W2 is taking place ("exposure of a substrate" means projection of patterned radiation onto the substrate as described above).

In the dual stage lithographic apparatus depicted in FIG. 1 an alignment system AS is provided on the left-hand side of the figure. A topography measurement system TMS is also provided on the left-hand side of the figure. The projection system PL is provided on the right-hand side of the figure. The alignment system AS measures the positions of alignment marks provided on a substrate W1 (schematically depicted by boxes P1, P2) which is held on a first substrate table WT1. The topography measurement system TMS measures the topography of the substrate W1. A pattern is simultaneously projected by the projection system PL onto a substrate W2 held on a second substrate table WT2. When measurement of the substrate W1 supported by the first substrate table WT1 is completed and exposure of the substrate W2 supported by the second substrate table WT2 is completed, the positions of the substrate tables are swapped over. The substrate W1 supported by the first substrate table WT1 is then exposed using patterned radiation projected by the projection system PL. The already exposed wafer W2 supported by the second substrate table WT2 is removed from the substrate table for subsequent processing. Another substrate is then placed on the second substrate table WT2 for measurement by the alignment system AS and the topography measurement system TMS prior to exposure using patterned radiation projected by the projection system PL.

An interferometer (not depicted) and/or other position measurement means may be used to monitor the position of the substrate table WT1 during alignment and topography measurements. A processor PR may receive data from the alignment system AS, the topography measurement system TMS and also receive substrate table WT1 position information. Since the substrate W is fixed on the substrate table WT1, position information relating to the substrate table may be taken as being position information relating to the substrate.

Figure 2:
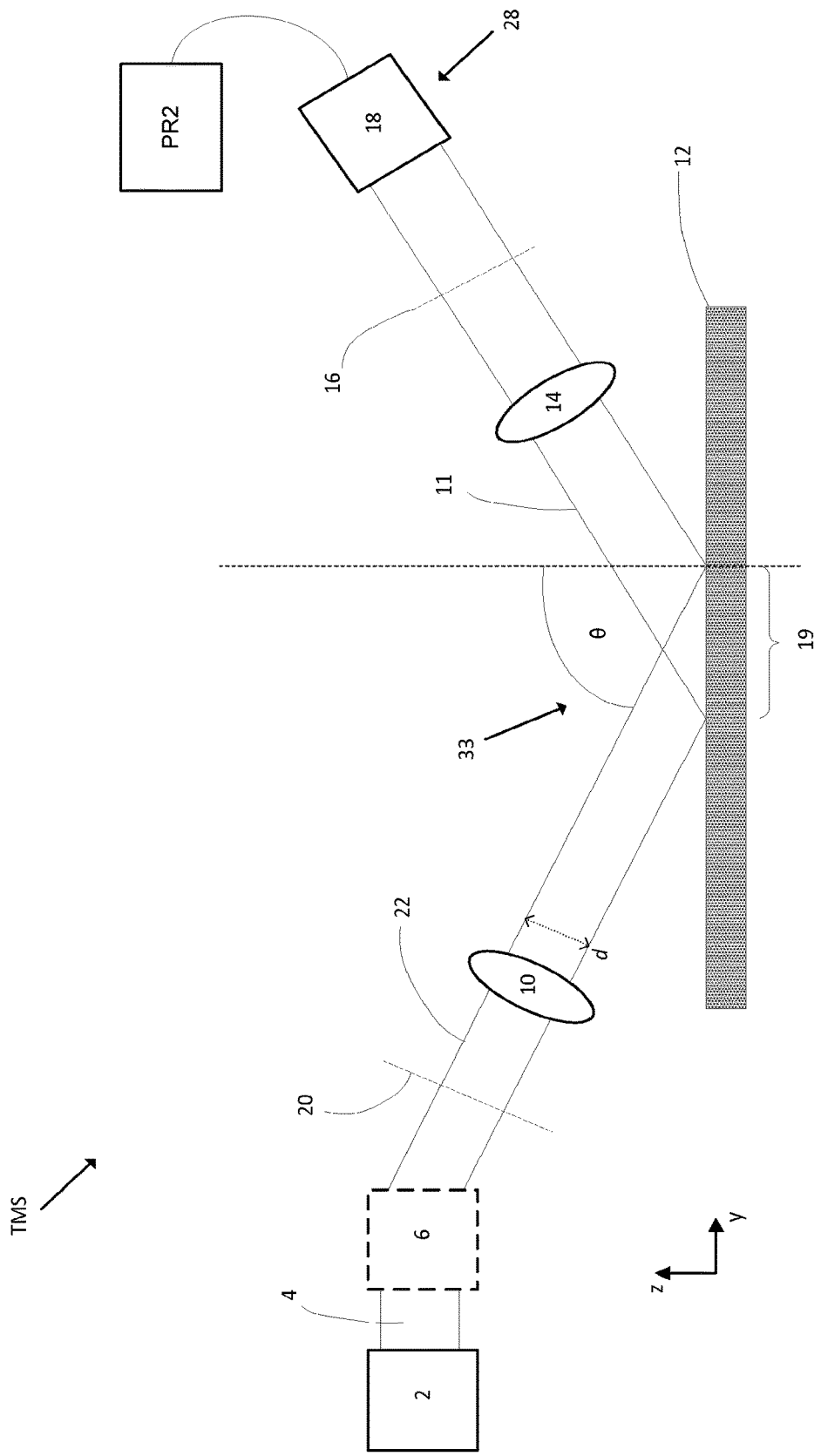
FIG. 2 schematically depicts the topography measurement system in more detail.

FIG. 2 is a schematic diagram of a topography measurement system TMS according to an embodiment of the invention. A radiation source 2 is configured to generate a radiation beam 4. Optics 6 may be provided to direct and/or focus the radiation beam 4. The radiation beam 4 is incident on a spatially coded grating 20 (which may also be referred to as the first grating 20). The form of the spatially coded grating is discussed further below. The radiation beam 4 is patterned with an image of the spatially coded grating 20 on passing through the grating. The patterned radiation beam may be referred to as a measurement beam 22 (or alternatively may be referred to simply as a radiation beam).

The measurement beam 22 passes through optics 10 that are configured to form an image of the spatially coded grating 20 at a target location 19 on a substrate 12. The measurement beam 22 is incident upon the substrate 12 at an angle of incidence θ. The spatially coded grating image 33 is formed at the indicated location.

The measurement beam 22 is reflected from the substrate 12 and passes through detection optics 14. The detection optics 14 are configured to receive the reflected measurement beam 11 and form an image of the spatially coded grating image 33. This image of the spatially coded grating image is formed at a second grating 16. The second grating 16 is not spatially coded. A detector 18 is configured to receive radiation transmitted through the second grating 16.

The detector 18 detects the intensity of radiation incident upon it and produces an output signal that is indicative of the intensity of the radiation.

The detector 18 may for example be a photodiode. An advantage of using a photodiode is that photodiodes have a fast response time and have a relatively low cost. The detector may be an imaging detector such as, for example, a charge coupled device (CCD), an active pixel sensor (APS), or any other suitable form of imaging detector. However, embodiments of the invention use a value indicative of the intensity of radiation incident upon the detector rather than an image output. Thus, the output from the imaging detector is converted into a value indicative of intensity of incident radiation in an embodiment in which an imaging detector is used. An imaging detector may have a slower response time than a photodiode, possibly reducing the speed at which the topography of a substrate 21 can be measured.

As the substrate 21 is scanned underneath the spatially coded grating image 33, changes in the height of the substrate cause changes of the phase distribution of radiation at the grating 16. The grating 16 converts these changes of the phase distribution into changes of radiation intensity at the detector 18. As a result, the signal output from the detector 18 is indicative of the height of the substrate 12. The signal output from the detector 18 may be analyzed by a digital signal processing system PR2 to determine the height of the substrate 12. The digital signal processing system PR2 may be used to generate a map of the topography of the substrate 12. The digital signal processing system PR2 may comprise, e.g., one or more microprocessors or one or more Field-Programmable Gate Arrays (FPGA), etc. The digital signal processing system PR2 may be a system dedicated to the topography measurement system TMS. Alternatively, the digital signal processing system PR2 may be a more general system that also processes digital signals from other functional modules in the lithographic apparatus of FIG. 1, e.g., from the alignment system AS in FIG. 1. For brevity, the term "processor" will be used in this text to cover any and all of such implementations of digital signal processing system PR2.

In general, a substrate will be provided with a plurality of patterned layers in order, for example, to create a multi-layer IC. Each layer is formed by projecting a patterned layer to expose resist on the substrate and then processing the substrate. The processing may for example comprise etching the resist, depositing material into recesses formed by the etching, and then polishing the substrate. This forms a layer of patterned material on the substrate. The thickness of the layer will depend upon the processing that is performed, and will vary from layer to layer. A set of patterned layers on a substrate may be referred to as a stack. A lithographic apparatus should be capable of projecting patterns onto substrates with stacks of widely varying compositions. The topography measurement system TMS of the embodiment of the invention is capable of measuring substrate topography for expected stack compositions. For clarity, the substrate topography measurement system TMS may also be referred to as a level sensing system or as a level sensor. As known, a level sensor is used to make a height map of the substrate. During projection of the pattern of the mask via the projection system onto the resist on the substrate, the relative position of the substrate with respect to the projection system is controlled in dependence on the height map so as to enable the relevant area of the substrate to be brought into focus.

Penetration of the measurement beam 22 into the substrate stack may cause interference effects which introduce errors into height measurements. The extent of the penetration that will occur depends on both the wavelength and the angle of incidence of the measurement beam. In general, the penetration depth of the measurement beam 22 decreases for decreasing wavelengths and decreases for increasing angles of incidence θ. Broadband radiation may be utilized to increase the accuracy of topography measurements, since the interference effects caused by reflections from different stack layers may approximately average out across a range of radiation wavelengths. Broadband ultraviolet radiation with wavelengths in the range 225-400 nm may, for example, be used by the topography measurement system TMS. The intensity of the radiation may be sufficiently low that it does not expose resist on the substrate. The topography measurement system TMS may provide an angle of incidence of the measurement beam which is greater than the angle of incidence used in conventional topography measurement systems.

The angle of incidence θ used in topography measurement systems is for example, say, 70°. Increasing the angle of incidence decreases the penetration depth of the measurement beam 22 into the substrate 21 sub-structure. This means that fewer stack reflections occur and their associated interference effects in the reflected measurement beam are avoided or reduced. By avoiding or reducing the interference effects caused by different stack reflections, process dependent errors of the topography measurement are reduced and the accuracy of the topography measurement system is increased. The angle of incidence θ may be increased so that it is greater than 70°. The angle of incidence θ may be chosen to lie between, say, 75° and 85°. In an embodiment, the angle of incidence θ may be, for example, around 80°. For ease of illustration FIG. 2, which is merely a schematic illustration, does not depict an 80° angle of incidence but instead depicts a smaller angle.

Increasing the angle of incidence θ from 70° to around 80° causes the reflectance of radiation from the substrate 21 surface to approximately double. That is, the intensity of radiation reflected from the substrate 21 approximately doubles. This advantageously increases the amount of radiation which is incident upon the detector 18. However, increasing the angle of incidence θ from 70° to around 80° also causes the size of the grating image 33 to approximately double. In other words the size of the illuminated target location is approximately doubled. When topography measurements are preformed, the height profile of the substrate is convolved with the illuminated target location 19. Doubling the illuminated target location 19 would reduce the spatial sampling rate of the topography measurement system if the grating 20 was a conventional grating rather than a spatially coded grating. However, the spatial sampling rate provided by the topography measurement system TMS is not reduced when the spatially coding grating 20 is used.

For clarity, a conventional grating is a structure comprised of periodically repeating unit cells, e.g., a regular array of lines a one-dimensional case. A spatially coded grating can be considered the result of modulating the conventional, regular, structure so as to produce an irregular, non-periodic structure. The spatial coding will be explained in detail further below.

Figure 3A:
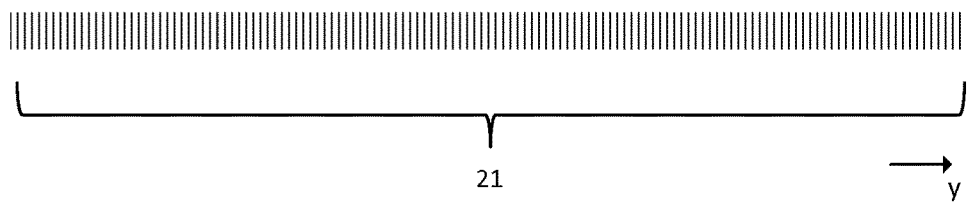
FIGS. 3a-3b schematically illustrate modifying a grating of a topography measurement system to produce a spatially coded grating as used by an embodiment of the invention.
Figure 3B:
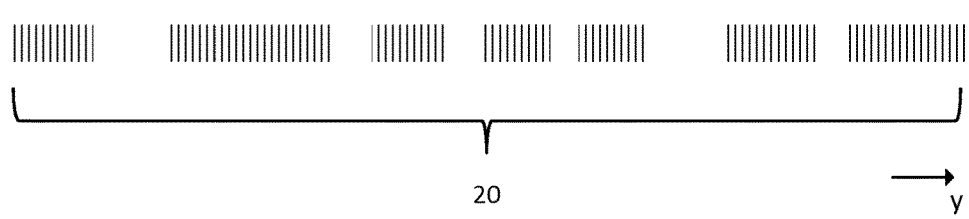

An example of applying spatial coding to a grating is depicted schematically in FIG. 3. FIG. 3a depicts a conventional periodic grating 21. In FIG. 3b the grating has been modulated using a binary sequence, and gaps are now present in the grating 20. The grating of FIG. 3 is now a spatially coded grating 20 and non-periodic.

It will be appreciated that FIG. 3 is merely a schematic illustration. In practice the modulation applied to a grating may have a spatial frequency which is higher than the spatial frequency of the grating itself. In other words, a plurality of lines may be added to a given space in the grating. Similarly, a plurality of spaces may be added to a given line in the grating.

Figure 4:
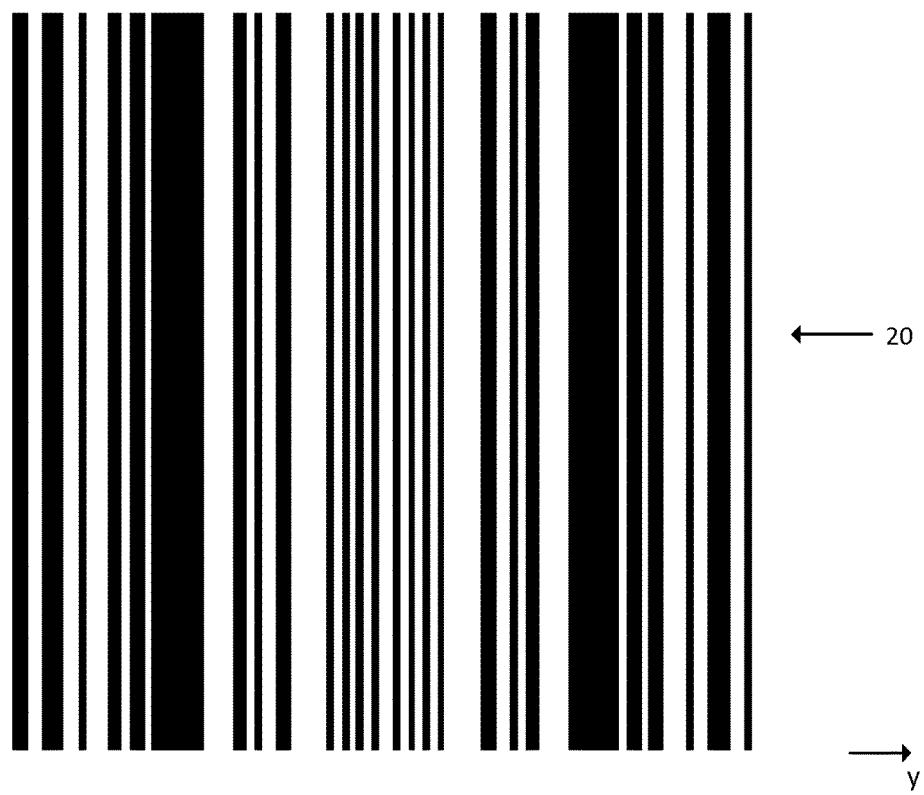
FIG. 4 schematically depicts a spatially coded grating which forms part of an embodiment of the topography measurement system.

An example of a spatially coded grating 20 which may be used by the topography measurement system TMS is schematically depicted in FIG. 4. In this instance the grating has been modulated by a pseudo-random sequence to form a spatially coded grating 20 having a pseudo-random structure.

Embodiments of the invention take advantage of the fact the scanning movement of the substrate 12 relative to the image 33 of a spatially coded grating 20 provides a convolution of the grating image with the height profile of the substrate 12. As known, a convolution is a mathematical operation on two functions that produces a third function. The third function is typically viewed as a modified version of one of the original functions. The mathematical operation that produces the inverse of the convolution is called a deconvolution. The spatial coding of the grating 20 allows a deconvolution to subsequently be performed, thereby providing a height measurement with a spatial resolution that is not limited to the length of the grating image 33 in the scanning direction but is instead limited to the size in the scanning direction of the smallest features which make up the grating image.

Figure 5:
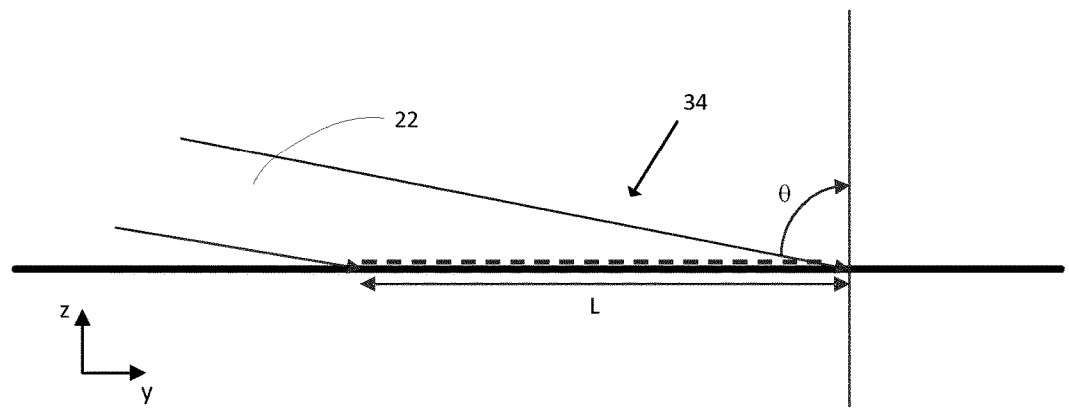
FIG. 5 schematically depicts a conventional topography measurement system radiation beam forming an image on a substrate.
Figure 6:
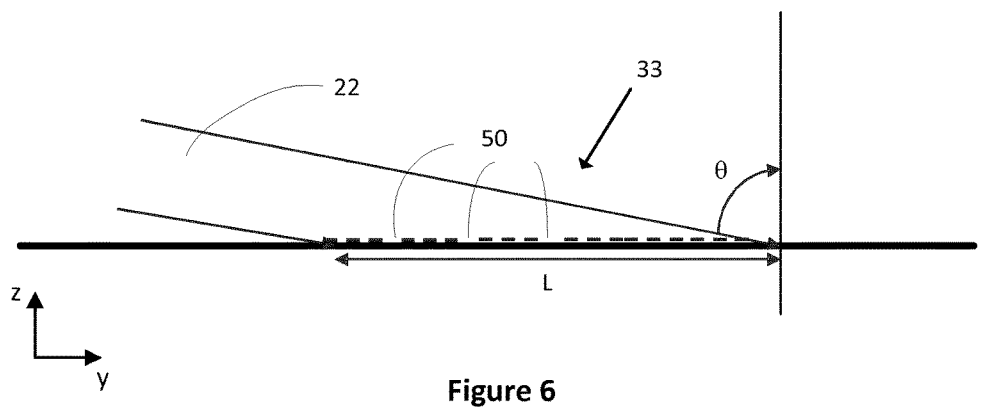
FIG. 6 schematically depicts a topography measurement system radiation beam according to an embodiment of the invention forming an image on a substrate.

FIG. 5 schematically depicts a grating image 34 formed by a measurement radiation beam 22 which has been patterned by a conventional periodic grating. The height measurement provided by the conventional grating image of FIG. 5 is a convolution of the substrate height and the grating image 34 (in the scanning direction). The spatial resolution is limited to the length L of the grating image 34, which may for example be of the order of 10 mm. This spatial resolution is not desirable because it may not be good enough to allow sufficiently accurate projection of images onto the substrate by the lithographic apparatus LA (see FIG. 1), FIG. 6 schematically depicts an image 33 formed when the measurement radiation 22 beam is patterned by a spatially coded grating. In this case the spatial sampling resolution is not determined by the length L of the grating image 33 but instead is directly dependent upon the maximum spatial frequency present in the coded pattern of the grating image 33. This is because the coding of the pattern is configured to allow discrimination between the different illuminated lines 50 of the grating image 33 during deconvolution. If the grating were a conventional periodic grating, as depicted in FIG. 5, then it would not be possible to discriminate between different lines of the grating because sufficient information is not available to allow that discrimination to be achieved. In other words, deconvolution of the grating image and the height profile of the substrate is not a sufficiently well-posed problem when using a conventional grating (there isn't sufficient information to perform the deconvolution). In contrast, when a spatially coded grating is used to form the grating image 33 deconvolution becomes a well-posed problem. That is, there is sufficient information available to allow the deconvolution to be performed. This allows the height profile of the substrate to be determined without the spatial resolution being limited to the length L of the grating image 33. Instead, the spatial resolution of the measurement is determined by the maximum spatial frequency of the pattern of the spatially coded grating image 33.

As the wafer is being linearly moved with respect to the image of the grating, the detected signal can be considered to be directly proportional to a convolution of the wafer's topography with the image of the grating. Since a convolution operation between two functions is equivalent to a multiplication operation in the Fourier (frequency) domain, the effect of the spatially coded grating 20 may be considered in the frequency domain. The frequencies which are present in the conventional grating image 34 of FIG. 5 are determined by the length L of the grating image and the pitch of the grating image. Because the grating is a periodic pattern formed from lines and spaces the frequencies present in the image are limited, and there are substantial gaps (zeros) in a frequency domain representation of the grating image (the frequency domain representation is a sinc function, i.e., sinc $(y)=\sin(y)/y$). These gaps mean that some frequencies in the substrate height profile (or: height map) will not be recorded, and this prevents a deconvolution of the grating image and the substrate height profile from being performed. In contrast to this, the spatially coded grating image 33 may be coded in such a way that it does not have frequency gaps (all frequencies have non-zero values over a range of frequencies of interest). Since there are no frequency gaps a deconvolution of the grating image and the substrate height profile can be performed.

This can be illustrated mathematically as follows. Let the true wafer surface profile be described by the function $h(x,y)$ where h represents the height of the wafer at the location (x, y). The surface profile $h(x,y)$ may also be referred to as the topography of the wafer. Let $S(x,y)$ represent the intensity distribution of the grating image. As described previously, the wafer topography is measured by scanning the grating image on the wafer and appropriately detecting the resulting reflection. The resulting measurement M (x,y) can be written as $$M(x,y)=S(x,y)\otimes h(x,y)+n(x,y) \quad (1)$$

where $n(x,y)$ is a noise term and $\otimes$ is the convolution operator.

The pattern $S(x,y)$ determines the resolution of the final wafer topography measurement (height measurement). The larger the pattern, the less resolved the wafer topography will be. Considering the above equation in frequency or Fourier space, where a convolution operation becomes a multiplication operation $$\tilde{M}(Kx,Ky)=\tilde{S}(Kx,Ky)\cdot\tilde{h}(Kx,Ky)+\tilde{n}(Kx,Ky) \quad (2)$$

where $\tilde{M}(Kx, Ky)$, $\tilde{S}(Kx, Ky)$, $\tilde{h}(Kx, Ky)$ and $\tilde{n}(Kx, Ky)$ represents the Fourier transforms of $M(x,y)$, $S(x,y)$, $h(x,y)$ and $n(x,y)$ respectively, and where Kx, Ky are spatial frequencies in the x-direction and in the y-direction, respectively. It can now be seen that the Fourier transform of the wafer topography is multiplied by the Fourier transform of the grating image. If the Fourier transform of the grating image, $\tilde{S}(Kx, Ky)$ is zero at some spatial frequencies, then the information present in $\tilde{h}(Kx, Ky)$ cannot be recorded at the detector. This information is fundamentally lost and cannot be recovered by any deconvolution method.

If, however, the spatially coded grating is designed in such a way that the Fourier transform of the grating image has no zeros, then a large part of the information of $\tilde{h}(Kx, Ky)$ can be recorded on the detector. As a result a higher resolution estimate of the true height profile $h(x,y)$ of the substrate can be retrieved from the measurements. Additionally, the spatially coded grating may be designed in such a way that the convolution of the grating image and the substrate height can be deconvolved efficiently.

The grating pattern $s(x,y)$ can be such that is it is 'coded' with 'deconvolution friendly' codes such that there exists a deconvolution code $d(x,y)$ such that $S(x,y)\otimes d(x,y)\approx\delta(x,y)$ where $\delta(x,y)$ is the delta function. When this deconvolution code is applied on the measured data in equation (1):

$$d(x, y) \otimes M(x, y) = d(x, y) \otimes [S(x, y) \otimes h(x, y) + n(x, y)] \quad (3)$$

$$\approx \delta(x, y) \otimes h(x, y) + d(x, y) \otimes n(x, y) = h(x, y) + n'(x, y) \quad (4)$$

where $n'(x,y)$ is the noise term. As it can be seen, if there is no noise present then the true height profile can be retrieved.

As noted above, the spatial sampling rate of the topography measurement system TMS of embodiments of the invention is not determined by the length L in the scanning direction of the grating image 33. Instead, it depends upon the maximum spatial frequency present in the grating image 33. In other words, it depends upon the size in the scanning direction of the smallest features of the grating image 33. The minimum achievable feature size S of the grating image is determined by:

$$S = \frac{\lambda}{2NA\cos\theta} \quad (5)$$

where $\lambda$ is the wavelength of the measurement radiation beam, NA is the numerical aperture of the topography measurement system and $\theta$ is the angle of incidence of the measurement radiation beam on the substrate being measured. For example, the wavelength may be 400 nm, the numerical aperture may be 0.022 and the angle of incidence may be 85°. In this case, the minimum achievable feature size in the spatially coded grating image is 104 μm. This means that, in this example, the maximum spatial resolution which may be achieved by the topography measurement system TMS is 208 μm (a factor of 2 is applied to satisfy the Nyquist criterion for the sampling rate). As will be appreciated, this is far smaller than the spatial resolution of around 10 mm that is provided by the conventional grating depicted in FIG. 5. In general, using a spatially coded grating will provide a spatial resolution that is superior to the spatial resolution provided by a conventional grating.

The size of a feature F on the grating 20 which is needed to form a feature of a given size S in the grating image 33 is determined by:

$$F=S\cdot\cos\theta \quad (6)$$

where $\theta$ is the angle of incidence of the measurement radiation beam. In this example, $\theta$ is 85° and the minimum grating image feature size S is 104 μm. As a result, the smallest feature F in the spatially coded grating will be 9 μm. This is more than an order of magnitude greater than the wavelength of the measurement radiation beam 22. As a result, the feature size of the grating will not have a significant effect upon the transmission of the grating (transmission would be reduced if the grating feature size was significantly smaller than the wavelength of the measurement radiation beam).

In general, the size of the smallest features of the spatially coded grating 20 may be selected to provide a desired measurement resolution (taking into account the numerical aperture of the topography measurement system and the angle of incidence of the measurement radiation beam). The smallest features of the spatially coded grating 20 may for example have a feature size of 20 microns or less. The smallest features of the spatially coded grating 20 may for example have a feature size of 10 microns or less.

The size of the smallest features of the spatially coded grating 20 may be selected to avoid significant transmission losses due to the spatially coded grating. Thus, the smallest features of the spatially coded grating may be greater than 150 nm (if the wavelength of the measurement radiation beam is 400 nm then transmission of the radiation will drop substantially for features which are 150 nm or smaller). The smallest features of the spatially coded grating may for example be greater than the longest wavelength of the measurement radiation beam multiplied by 0.3.

The coding which is applied to a grating to obtain the spatially coded grating 20 in embodiments of the invention may be any suitable form of coding. The coding may be expressed as a matrix. For example, a Hadamard matrix may be applied to the grating. In another example a uniformly redundant array sequence may be applied to the grating. The Hadamard matrix and the uniformly redundant array are advantageous because they have perfect coding and decoding properties. Perfect coding and decoding properties may be interpreted as meaning that a delta function as is output when the coding matrix is multiplied by the decoding matrix. Other forms of coding may be applied to the grating. For example, a random or pseudo-random sequence may be applied to the grating. These are less advantageous because they do not have perfect coding and decoding properties. In general, the coding applied to the grating may comprise a generally broad and generally flat frequency spectrum over a range of frequencies of interest. In this context the term "generally broad and generally flat" may be interpreted as meaning not including a periodically appearing zero value (as may be seen for example in a sinc function generated by a conventional grating).

The range of frequencies of interest corresponds with the spatial frequency range over which the height of the substrate is measured, and this in turn is determined by the minimum feature size of the grating image. If the minimum grating image feature size S is around 100 μm then this may be expressed as a spatial frequency of $10^4$ m$^{-1}$. The range of spatial frequencies of interest is then from zero to $10^4$ m$^{-1}$. If the minimum grating image feature size S is around 10 μm then the range of spatial frequencies of interest is from zero to $10^5$ m$^{-1}$.

The spatially coded grating may be any grating which is not periodic (i.e. which does not consist of a spatially repeating pattern) after it has been spatially coded. The spatially coded grating may be a series of lines which do not form a repeating pattern.

The spatially coded grating may comprise a grating which has been modified by applying coding to the grating. The modification may be applied before the grating is fabricated. Applying coding to the grating may comprise adding lines into spaces of the grating, and may comprise adding spaces into lines of the grating.

Deconvolution of the signal output from the detector 18 may be performed by the processor PR2. That is, the processor PR2 may apply spatial decoding to the signal output from the detector. The processing applied by the processor may be considered to be digitally convolving a decoding mask with the signal output from the detector 18. This provides an output signal indicative of the height of the substrate 12.

A decoding sequence used by the processor PR2 may be expressed as a matrix. Where this is the case the decoding matrix may correspond with a coding matrix used to code the grating 20, except that positive values in the coding matrix are replaced with negative values in the decoding matrix. The decoding matrix may be the inverse matrix of the coding matrix. For example, if the coding matrix is a Hadamard matrix or a uniformly redundant array, the decoding matrix may be the inverse matrix of that Hadamard matrix or uniformly redundant array.

In an embodiment, the decoding matrix is based upon an inverse of the coding matrix, but is modified to take into account properties of the topography measurement system and/or the environment. For example, the decoding matrix may be modified to subtract an unwanted DC background signal. This may be achieved by applying an adjustment which assumes that the data being processed should have a zero mean. In another example the decoding matrix may be modified to remove measured values which have a signal to noise ratio that is below a predetermined threshold.

The decoding matrix may be determined mathematically via a comparison of the output signal obtain using the topography measurement system, and height measurements obtained for the same substrate using an air gauge. An air gauge directs a stream of air onto a surface and then measures the pressure of air reflecting from the surface back towards a pressure sensor on the air gauge. The pressure of this backflow of air is proportional to the distance between the air gauge and the surface. The topography measurements performed using the air gauge do not experience process dependent errors. An initial decoding matrix may be determined as the inverse matrix of the coding matrix. Values of the decoding matrix may then be modified iteratively to provide improved correspondence between the substrate height as measured using the topography measurement system and the substrate height as measured using the air gauge. This may be considered to be a calibration process for the decoding matrix.

The second grating 16 may have a pitch which corresponds with the pitch that the spatially coding grating 20 would have if no spatial coding had been applied to that grating. As mentioned further above, when spatial coding is applied to the first grating 20 this may comprise adding spaces into lines of that grating and adding lines into spaces of that grating. The first grating 20 thus has an initial pitch before the spatial coding is applied, and the pitch of the second grating 16 may correspond with that initial pitch.

The pitch of the second grating 16 may be a multiple or a fraction of the initial pitch of the first grating 20. For example, the pitch of the second grating 16 may be two times or four times the pitch of the first grating 20. For example, the pitch of the second grating 16 may be a half or a quarter of the pitch of the first grating 20.

A plurality of topography measurement systems TMS may be provided. That is, multiple radiation sources 2 and spatially coded gratings 20 may be used to produce multiple measurement radiation beams 22 which may then pass through multiple illumination optics 10 and illuminate multiple target locations on the substrate 12. Multiple detectors 18 and multiple second gratings 16 may be used to detect the measurement radiation beams and provide output signals. The processor PR2 may receive the output signals and convert these into substrate height measurements. The processor PR2 may generate a height map for the substrate 21 using the measurements. Using multiple measurement radiation beams in this manner is advantageous because it allows a height map to be generated for the substrate 21 more quickly (it allows the substrate to be scanned in fewer strokes). The plurality of topography measurement systems may be referred to as a topography measurement apparatus.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

The illumination optics, optics and detection optics may encompass various types of optical components, including refractive, reflective, and catadioptric optical components for directing, shaping, or controlling the beam of radiation.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Embodiments of the invention may be implemented in hardware, firmware, software, or any combination thereof. The processor PR2 may be connected to a memory which stores processor readable instructions that when executed will apply apply a decoding sequence to a signal output from the detector 18 Embodiments of the invention may also be implemented as instructions stored on a computer-readable medium, which may be read and executed by one or more processors. A computer-readable medium may include any mechanism for storing or transmitting information in a form readable by a machine (e.g., a computing device). For example, a computer-readable medium may include read only memory (ROM); random access memory (RAM); magnetic disk storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A topography measurement system for measuring a topography of a substrate, the measurement system comprising:

a spatially coded grating configured to produce a patterned beam of radiation;

a second grating configured to receive a reflected patterned beam of radiation after the patterned beam has been reflected from a target location on the substrate, wherein a phase distribution of the patterned beam is changed by the topography such that the reflected patterned beam comprises information of the topography; and a detector configured to receive the reflected patterned beam and to output an output signal representative of the reflected patterned beam.

2. The topography measurement system of claim 1, wherein the spatially coded grating comprises a series of lines which do not form a repeating pattern.

3. The topography measurement system of claim 1, wherein a spatial resolution of a measurement is based on a maximum spatial frequency of the spatially coded grating.

4. The topography measurement system of claim 1, wherein transmission losses due to the spatially coded grating are substantially avoided by selecting a feature size of the spatially coded grating that is greater than 0.3 times a wavelength of the patterned beam.

5. The topography measurement system of claim 1, further comprising:

a digital signal processor configured to perform at least one of following operations:

applying a decoding sequence to data representative of the output signal and thereby produce a further output signal indicative of the topography;

applying a decoding matrix which is an inverse of a matrix used to code the spatially coded grating; and applying a decoding matrix which is based upon an inverse of a matrix used to code the spatially coded grating but which has been modified before use.

6. The topography measurement system of claim 1, wherein the spatially coded grating comprises a pattern corresponding to a Hadamard matrix or a uniformly redundant array.

7. The topography measurement system of claim 1, wherein the spatially coded grating comprises a pattern of a random sequence or a pseudo-random sequence.

8. The topography measurement system of claim 1, wherein the spatially coded grating has a Fourier transform from which periodic frequency gaps are absent.

9. The topography measurement system of claim 1, wherein the patterned beam comprises radiation in a wavelength range between 225 nm and 400 nm.

10. The topography measurement system of claim 1, further comprising:

a second spatially coded grating configured to produce a second patterned beam of radiation;

a fourth grating configured to receive a second reflected patterned beam of radiation after the second patterned beam has been reflected from a second target location on the substrate, wherein a phase distribution of the second patterned beam is changed by the topography such that the second reflected patterned beam comprises additional information of the topography; and a second detector configured to receive the second reflected patterned beam and to output a second output signal representative of the second reflected patterned beam.

11. A lithographic apparatus comprising:

an illumination system configured to condition a radiation beam;

a support configured to support a patterning device, the patterning device configured to pattern a cross-section of the radiation beam to form a patterned radiation beam;

a substrate table configured to hold a substrate;

a projection system configured to project the patterned radiation beam onto a target portion of the substrate; and a topography measurement system configured to measure a topography of the substrate, the topography measurement system comprising:

a spatially coded grating configured to generate a second patterned radiation beam that is directed to reflect from a target location on the substrate to generate a reflected patterned radiation beam;

a second grating configured to receive the reflected patterned radiation beam, wherein a phase distribution of the second patterned radiation beam is changed by the topography such that the reflected patterned radiation beam comprises information of the topography; and a detector configured to receive the reflected patterned radiation beam and to generate an output signal representative of the reflected patterned radiation beam.

12. A method for measuring a topography of a substrate, the method comprising:

generating a spatially coded patterned radiation beam;

reflecting the spatially coded patterned radiation beam from a target location of the substrate to produce a reflected patterned radiation beam, wherein a phase distribution of the spatially coded patterned radiation beam is changed by the topography such that the reflected patterned radiation beam comprises information of the topography;

receiving the reflected patterned radiation beam at a second grating;

receiving the reflected patterned radiation beam at a detector via the second grating; and generating an output signal representative of the reflected patterned radiation beam.

13. The method of claim 12, further comprising applying a decoding sequence to the output signal to obtain an output signal indicative of the topography of the substrate.

14. The topography measurement system of claim 1, wherein the second grating is not spatially coded.

15. The topography measurement system of claim 1, wherein the detector comprises a photodiode, a charge coupled device, or an active pixel sensor.

16. The topography measurement system of claim 1, wherein an incidence angle of the patterned beam on the substrate is greater than 70°.

17. The topography measurement system of claim 1, wherein an incidence angle of the patterned beam on the substrate is between 75° and 85°.

18. The topography measurement system of claim 5, wherein a convolution of the decoding sequence and a code of the spatially coded grating generates approximately a delta function.

19. The lithographic apparatus of claim 11, wherein the spatially coded grating comprises a series of lines which do not form a repeating pattern.

20. The lithographic apparatus of claim 11, wherein the topography measurement system further comprises:

a digital signal processor configured to perform at least one of following operations:

applying a decoding sequence to data representative of the output signal and thereby produce a further output signal indicative of the topography;

applying a decoding matrix which is an inverse of a matrix used to code the spatially coded grating; and applying a decoding matrix which is based upon an inverse of a matrix used to code the spatially coded grating but which has been modified before use.

\* \* \* \* \*